(12) United States Patent
Narducci et al.

(10) Patent No.: US 8,289,018 B2
(45) Date of Patent: Oct. 16, 2012

(54) GRADIENT MAGNETOMETER ATOM INTERFEROMETER

(75) Inventors: Frank A. Narducci, St. Leonard, MD (US); Jon P. Davis, Lusby, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 265 days.

(21) Appl. No.: 12/905,177

(22) Filed: Oct. 15, 2010

(65) Prior Publication Data

US 2011/0101972 A1    May 5, 2011

Related U.S. Application Data

(60) Provisional application No. 61/255,900, filed on Oct. 29, 2009.

(51) Int. Cl.
  *G01R 33/02*  (2006.01)
  *G01V 3/00*   (2006.01)
  *H05H 3/00*   (2006.01)

(52) U.S. Cl. .......... 324/244; 324/301; 250/251

(58) Field of Classification Search .......... 324/244, 324/301; 250/251
See application file for complete search history.

(56) References Cited

U.S. PATENT DOCUMENTS 5,274,231 A     12/1993  Chu et al.
7,915,577 B2 *  3/2011   Fatemi et al. .......... 250/251

* cited by examiner

*Primary Examiner* — Bot Ledynh
(74) *Attorney, Agent, or Firm* — Mark O. Glut; Mark D. Kelly

(57) ABSTRACT

Measuring a magnetic gradient according to the present invention includes generating a beam of like atoms with magnetic sublevels, applying a first pulse of electro-magnetic radiation to the beam of atoms to create a coherent superposition of the magnetic sublevels in the atoms in which the superposition results in a plurality of beams following separate paths and in which at least two of the paths are arms of an interferometer, applying a second pulse of electromagnetic radiation to both beams of atoms a time T later with characteristics substantially similar to the first pulse and in which the product of the Rabi frequency and T now must equal $\pi$ (versus $\pi/2$ in the first pulse), whereby the states of the atoms in the two arms of the interferometer are coherently interchanged and are redirected towards each other. The beams of atoms are then recombined by apply a third pulse of electromagnetic radiation a time $T \pm \Delta t$ after the second pulse with characteristics substantially similar to the first pulse such that the paths form a closed loop. Then, a detecting pulse of light is used to detect the number of atoms in one magnetic sublevel versus another magnetic sublevel.

13 Claims, 11 Drawing Sheets

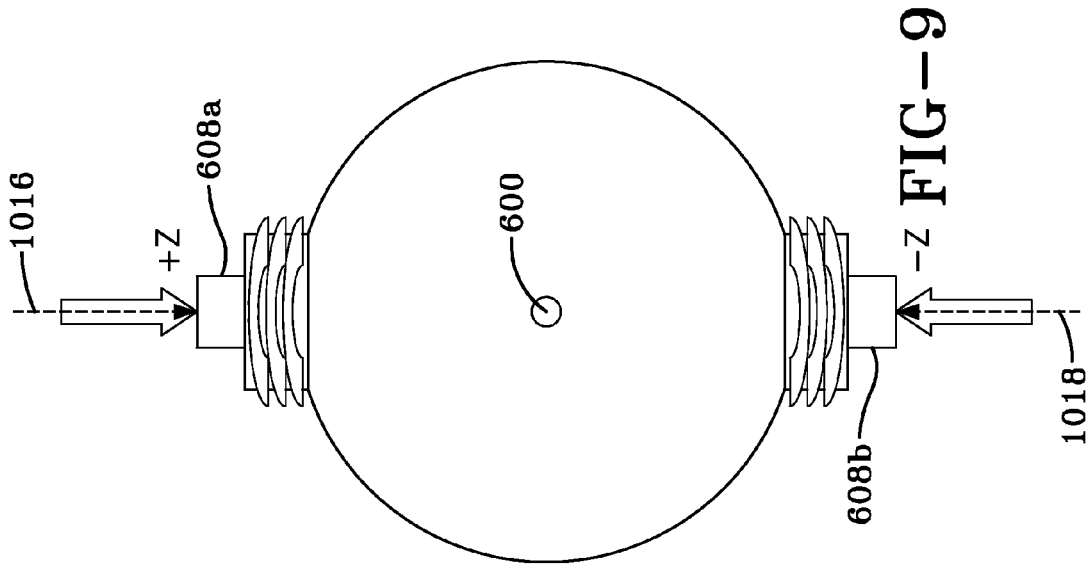
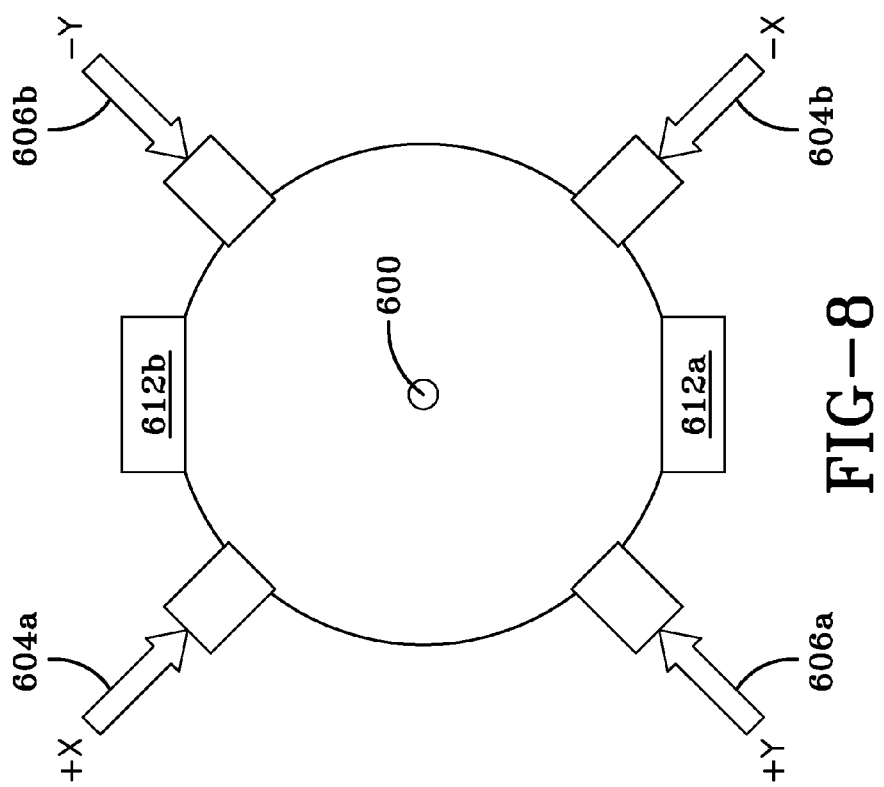

GRADIENT MAGNETOMETER ATOM INTERFEROMETER

CROSS-REFERENCE TO RELATED APPLICATIONS

This application claims the benefit of priority from U.S. Provisional Patent Application Ser. No. 61/255,900, filed on Oct. 29, 2009.

GOVERNMENT INTEREST

The invention described herein may be manufactured, licensed, and used by or for the U.S. Government.

BACKGROUND

The field of atomic magnetometry has seen significant progress in the last several years. Magnetometers have been demonstrated based on quantum coherence in dilute gases (Budker, D.; Gawlik, W.; Kimball, D. F.; Rochester, S. M.; Yashchuk, V. V.; Weis, A. Rev. Mod. Phys. 2002, 74, 1153-1201, and references within), high density gases (Sautenkov, V. A.; Lukin, M. D.; Bednar, C. J.; Novikova, I.; Mikhailov, E.; Fleischhauer, M.; Velichansky, V.; Weach, G. R.; Scully, M. O. Phys. Rev. A 2000, 62, 023810-1-4; Matsko, A. B.; Novikova, I.; Scully, M. O.; Welch, G. R. Phys. Rev. Lett. 2001, 87, 133601-1-4), and in a spin exchange-free environment (Kominis, I. K.; Kornack, T. W.; Allred, J. C.; Romalis, M. V. Nature 2003, 422, 596; Allred, J. C.; Lyman, R. N.; Kornack, T. W.; Romalis, M. V. Phys. Rev. Lett. 2002, 89, 130801-1-4). Additionally, through a careful trade-off of power, size, etc. against sensitivity, very small yet sensitive magnetometers have been developed. (Schwindt, P. D. D.; Hollberg, L.; Kitching, J. Rev. Sci. Inst. 2005, 76, 126103; Balabas, M. V.; Budker, D.; Kitching, J.; Schwindt, P. D. D.; Stalnaker, J. E. JOSA B 2006, 23, 1001-1006). In particular, sensitivities approaching 100 attoTesla $Hz^{-1/2}$ have been demonstrated. However, in magnetically noisy environments, increased sensitivity does not necessarily improve the overall performance of the system, since the magnetometer can be dominated by ambient noise, rather than the signal. This is often the case in applications involving airborne anti-submarine warfare (ASW) and mine detection. Thus, there is a need for a magnetometer that provides increased sensitivity and still performs well in magnetically noisy environments.

BRIEF DESCRIPTION OF THE DRAWINGS

Exemplary embodiments according to the invention are illustrated in the accompanying drawings in which like reference numerals represent like parts throughout and in which:

FIG. 8 depicts a schematic of a vacuum chamber as viewed from above that houses a gradient magnetometer atom interferometer, in accordance with the disclosed subject matter;

FIG. 9 depicts a side view of the vacuum chamber depicted in FIG. 8;

DETAILED DESCRIPTION

In the following detailed description, reference is made to the accompanying drawings which are a part of this patent disclosure, and in which are shown by way of illustration specific embodiments in which the invention, as claimed, may be practiced. This invention may, however, be embodied in many different forms and should not be construed as limited to the embodiments set forth; rather, these embodiments are provided so that this disclosure will be thorough and complete, and will fully convey the scope of the invention to those skilled in the art.

Embodiments according to the present invention involve a system and a method for an atom interferometer gradient magnetometer that utilizes a coherent superposition of magnetic sublevels. In one embodiment the system can be created, using only three levels. The results from that model are compared to results obtained from a full 24 level analysis.

Figure 1:
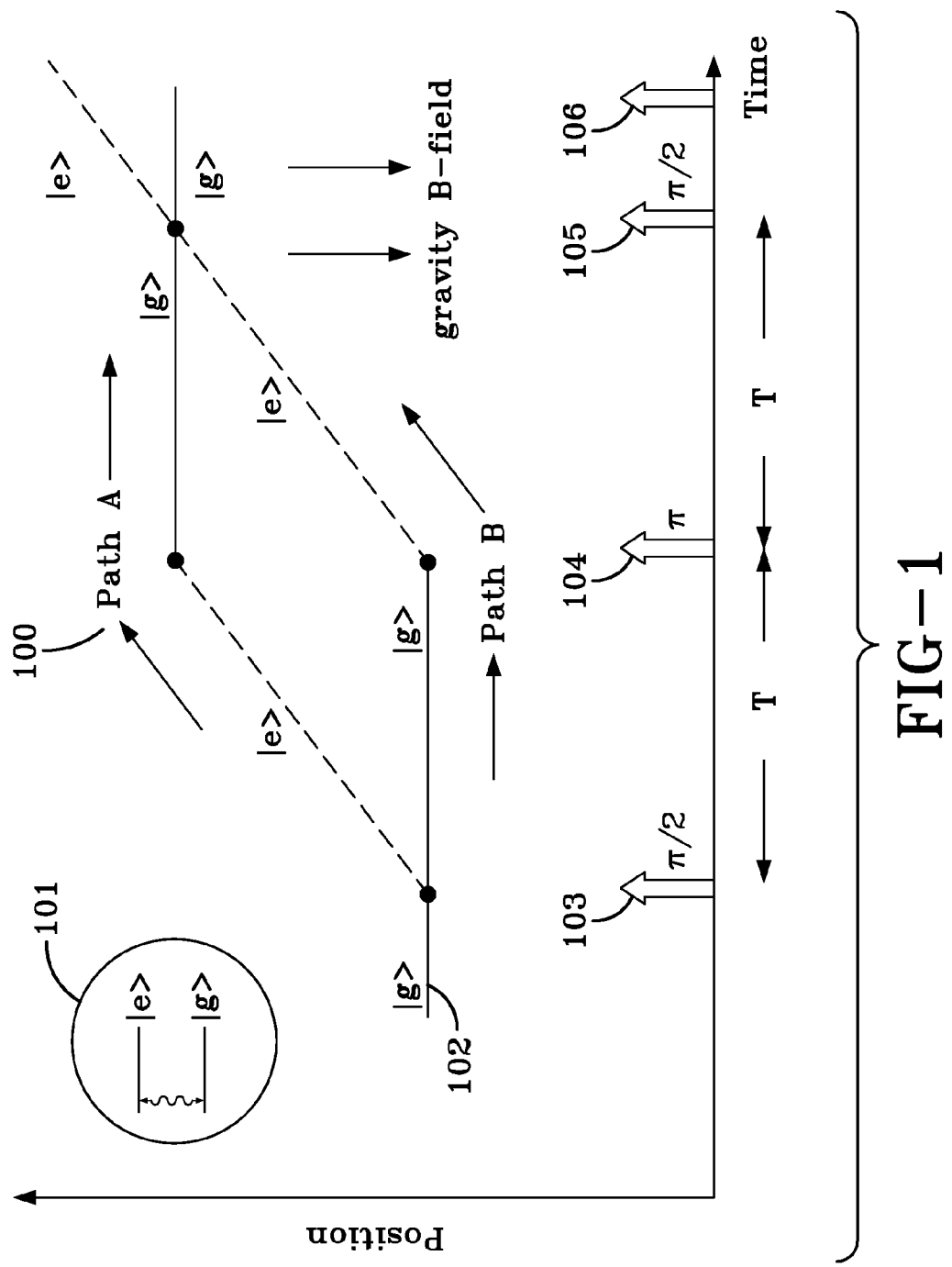
FIG. 1 is a conceptual representation of a gradient magnetometer atom interferometer in accordance with the disclosed subject matter.

FIG. 1 shows a conceptual schematic drawing of an embodiment of a gradient magnetometer atom interferometer according to the present invention. A two level system (where the two levels are two magnetic sublevels of a single hyperfine state) of moving cold atoms is illustrated. At time t=0, the atoms are irradiated by a so-called $\pi/2$ pulse, which, in analogy to NMR techniques, creates a superposition of two states. Some time T later, a $\pi$ pulse is applied, whose action is to convert any atom in the ground state to the excited state and any atom in the excited state into the ground state. Finally, at time 2T, a second $\pi/2$ is applied.

The equations that describe the probability amplitude of finding a two-level atom in the excited state (ground state) at a time $t_o + \tau$ (denoted by $c_e(t_o+\tau)(c_g(t_o+\tau))$ given a probability $c_e(t_0)(c_g(t_0))$ at time $t_o$, are as follows:

$$c_e(t_o + \tau) = c_e(t_o)\cos\left(\frac{1}{2}\Omega_r\tau\right) - ic_g(t_o)e^{-i\phi}\sin\left(\frac{1}{2}\Omega_r\tau\right) \quad (1a)$$

$$c_g(t_o + \tau) = -ic_e(t_o)e^{i\phi}\sin\left(\frac{1}{2}\Omega_r\tau\right) + c_g(t_o)\cos\left(\frac{1}{2}\Omega_r\tau\right) \quad (1b)$$

where $\Omega_r$ is the generalized Rabi frequency that characterizes the strength of the laser field-atom transition coupling and $\phi$ is the initial phase of the field. Here, $$\Omega_r = \sqrt{\Omega^2 + \delta^2} \qquad (2)$$

where $\delta = \omega_L - \omega_A$ is the detuning of the laser frequency from the atomic resonance frequency $\omega_A$ and $\Omega$ is the zero-detuning Rabi frequency, given by $$\Omega = \frac{2\mu_{12} \cdot e_L \varepsilon}{\hbar} \qquad (3)$$

In Eq. 3, $\mu_{12}$ is the (vector) transition dipole strength, $e_L$ is the laser's polarization vector and $\varepsilon$ is the laser's electric field amplitude. What is important to note in Eq. 1a and Eq. 1b is the dependence of the probability amplitudes on the phase of the laser.

Consider two level atoms that travel through the gradient magnetometer atom interferometer depicted in FIG. 1 which is subject to a gravitational field (oriented down in the figure) as well as a magnetic field, which is also assumed to be oriented down in the figure for convenience. The effects of gravity are included to be able to make a connection with the previous treatments such as the work of Young, Kasevich, and Chu, (see, e.g., Atom Interferometry Berman, P., Ed.; Academic Press: New York, 1997), Storey and Cohen-Tannoudjii, (J. Phys. II. 1994, 4, 1999-2028) and Peters, Chung, and Chu, (Metrologia 2001, 38, 25-62). The phase shift $\Delta\phi$ of the interference pattern at the end of the interferometer is given by two contributions: $\Delta\phi = \Delta\phi_{path} + \Delta\phi_{Laser}$ where $\Delta\phi_{Path}$ is a measure of the classical action along the path, and $\Delta\phi_{Laser}$ is a measure of the phase difference imprinted on the atoms by the laser field at different locations.

Phase due to Classical Action

The phase difference along the path of the interferometer is given by the integral of the classical along the two separate paths, upper arm path A and lower arm path B, $$\Delta\phi_{Path} = (S_{cl}^B - S_{cl}^A)/\hbar \qquad (4)$$

where $S_{cl}^i$ (i=A, B) denotes the classical action along path i, given by the integral of the Lagrangian L along the path i $$S_{cl} = \int_0^{2T} L[z(t), \dot{z}(t)] dt \qquad (5)$$

The potential energy of a neutral particle moving in a gravitational and magnetic field is given by $$U = mgz(t) - \mu_m B[z(t)] \qquad (6)$$

Where $\mu_m$ is the magnetic moment of the atom. The Lagrangian is given by $$L = \frac{1}{2}m\dot{z}(t)^2 - mgz(t) + \mu_m B[z(t)] \qquad (7)$$

Beginning with the generic forms of the equations of motion for a particle starting at $t_o$ with some initial velocity $v_o$, moving in a uniform gravitational field and a gradient magnetic field:

$$z(t) = z_o + v_o(t - t_o) - \frac{1}{2}a(t - t_o)^2 \qquad (8a)$$

$$\dot{z}(t) = v_o - a(t - t_o) \qquad (8b)$$

where a is the combined acceleration of the particle due to gravity and the force due to the gradient magnetic field. Here, $$a = g - \frac{\mu_m}{m}\frac{dB}{dz} \qquad (9)$$

The Lagrangian becomes $$L = \frac{1}{2}m[\dot{z}(t)]^2 - maz(t) \qquad (10)$$

$$= \frac{1}{2}mv_o^2 - 2mav_o(t - t_o) + ma^2(t - t_o)^2 - maz_o$$

From this, the general form of the classical action can be calculated:

$$S_{cl} = \frac{1}{2}mv_o^2(t - t_o) - mav_o(t - t_o)^2 + \frac{1}{3}ma^2(t - t_o)^3 - maz_o(t - t_o) \qquad (11)$$

Now we can take the initial position $z_o = 0$ Then we have $$S_{cl}^A(0 - T) = \frac{1}{2}mv_o^2 T - mav_o T^2 + \frac{1}{3}ma^2 T^3 \qquad (12)$$

$$S_{cl}^B(0 - T) = \frac{1}{3}ma^2 T^3$$

$$\Delta S_{cl}(0 - T) = mav_o T^2 - \frac{1}{2}mv_o^2 T$$

At times t=T and t=2T the $\pi/2$ and $\pi$ pulses are applied. We will assume some velocity $v_o'$ (arm A) and $v_o''$ (arm B) after these pulses. Then, we have:

$$S_{cl}^A(T \text{ to } 2T) = \frac{1}{2}mv_o'^2 T - mav_o' T^2 + \frac{1}{3}ma^2 T^3 - maz_o' T \qquad (13)$$

$$S_{cl}^B(T \text{ to } 2T) = \frac{1}{2}mv_o''^2 T - mav_o'' T^2 + \frac{1}{3}ma^2 T^3 - maz_o'' T$$

$$\Delta S_{cl}(T \text{ to } 2T) = \left[\frac{1}{2}m(v_o''^2 - v_o'^2) + mg(z_o' - z_o'')\right]T + ma(v_o' - v_o'')T^2$$

Therefore, the general expression for the difference in the total classical action from 0 to 2T is given by:

$$\Delta S_{cl}(0 \text{ to } 2T) = \qquad (14)$$

$$ma(v_o + v_o' - v_{o9v''}'')T^2 + \left[\frac{1}{2}m(v_o''^2 - v_o'^2 - v_o^2) + ma(z_o' - z_o'')\right]T$$

Now, $z_o'(z_o'')$ is the position of the atom in the A(B) arm at time T. This position can be calculated from Equation (8).

$$z'_o = v_o T - \frac{1}{2} A T^2 \quad (15)$$

$$z''_o = -\frac{1}{2} a T^2$$

$$z'_o - z''_o = v_o T$$

so that, $$\Delta S_{cl}(0 \text{ to } 2T) = ma(2v_o + v'_o + v''_o)T^2 + \frac{1}{2} m(v''^2_o - v'^2_o - v^2_o)T \quad (16)$$

At this point, the different velocities after the pulses are calculated.

$$v_o = \frac{\hbar k_{eff}}{m} \quad (17)$$

In the A arm, after a time T, the velocity becomes $v_o - aT$. The light beams give this atom a kick, so that:

$$m(v_o - aT) - \hbar k_{eff} = v'_o \quad (18)$$

$$v'_o = -aT$$

In the B arm, after a time T, the atom has a velocity $-aT$. After the kick:

$$-maT + \hbar k_{eff} = mv''_o \quad (19)$$

$$v''_o = v_o - aT$$

Then $$v_o'' = v'_o + v_o \quad (20)$$

Using Equations (17), (18), (19) and (20), $$\Delta S_{cl}(0 \text{ to } 2T) = 0 \quad (21)$$

This result is reasonable because the two paths are identical action segments which occur in a different time order.

Phase Due to Laser Field

The phase of the electric field at the time of the laser pulses plays a key role in the embodiments of a gradient magnetometer atom interferometer according to the present invention. In order to calculate the effects, the effect of the pulse on the atom must first be calculated. Equations for the evolution of a two-level atom in a laser field and conventional notation will be used. Four cases are considered. For simplicity, $\delta = 0$ in Equations (1a) and (1b):

Atom Initially in the Ground State, Subject to a $\pi/2$ Pulse:
For an atom initially in the ground state with $\Omega_r \tau = \pi/2$:

$$c_e(t+\tau) = -\frac{1}{\sqrt{2}} i e^{-i\phi} \quad (22)$$

$$c_g(t+\tau) = \frac{1}{\sqrt{2}}$$

Atom Initially in the Ground State, Subject to a $\pi$ Pulse:
For an atom initially in the excited state and $\Omega_r \tau = \pi$:

$$c_e(t_o + \tau) = -ie^{-i\phi}$$

$$c_g(t_o + \tau) = 0 \quad (23)$$

Atom Initially in the Excited State, Subject to a $\pi$ Pulse:
For an atom initially in the excited state and $\Omega_r \tau = \pi$, $$c_e(t+\tau) = 0$$

$$c_g(t+\tau) = -ie^{i\phi} \quad (24)$$

Now the phase is traced as it changes through the different arms. Consider Path A first. The atom is initially in the ground state, then is promoted to the excited state by the it $\pi/2$ pulse at time $t_1 = 0$. The atom then sees the $\pi$ pulse, putting it back in the ground state at time $t_2 = T$. Finally, the atom sees the final $\pi/2$ pulse, putting it back in the excited state at time $t_3 = 2T$. From Equations (22) and (25), the phase induced by the field along Path A is obtained:

$$\Delta \phi^A = \phi^A(t_1) - \phi^A(t_2) + \phi^A(t_3) \quad (25)$$

Now consider Path B. The atom is initially in the ground state, then is left in the ground state by the it $\pi/2$ pulse ($t_1 = 0$). The atom then sees the $\pi$ pulse, promoting it into the excited state at time $t_2 = T$. Finally, the atom sees the final $\pi/2$ pulse, leaving it in the excited state ($t_3 = 2T$). From Equations (22) and (23), the phase shift induced along Path B is obtained:

$$\Delta \phi^B = -\phi^B(t_2) \quad (26)$$

Therefore, the overall phase difference is given by:

$$\Delta \phi = \Delta \phi^B - \Delta \phi^A = [-\phi^B(t_2) \Delta \phi^A] - [\phi^A(t_1) - \phi^A(t_2) + \phi^A(t_3)] \quad (27)$$

$$= [\phi^A(t_1) - \phi^A(t_2)] - [\phi^B(t_2) - \phi^A(t_3)]$$

Finally, the phase shift is obtained by substituting $kz(t)$ for the various phase shifts in Equation (28), as follows:

$$\Delta \phi = -kaT^2 = -k\left(g - \frac{\mu_m}{m} \frac{dB}{dz}\right) T^2 \quad (28)$$

Equation (28) is a significant result and represents a goal of the experiments that underlie embodiments of a gradient magnetometer atom interferometer according to the present invention. As demonstrated in earlier works, the phase shift in an atom interferometer in which the atoms are subject to a gravitational acceleration is proportional to g and also to T (the time between pulses) squared. However, it has now been shown that if the superposition of states utilized in the interferometer are magnetically sensitive states, the phase shift does not depend on the magnitude of the magnetic field but is dependent on the gradient of the magnetic field.

Beam Splitter

The previous section analyzed the dependence of the interferometer phase on the gradient of the magnetic field, with the assumption that coherent superpositions of magnetically sensitive transitions can be created. In this section, a simple three-level theoretical model is used to demonstrate that this assumption is correct. At the end of the section, the results from this simple model are connected with an experimentally realizable system.

Figure 2:
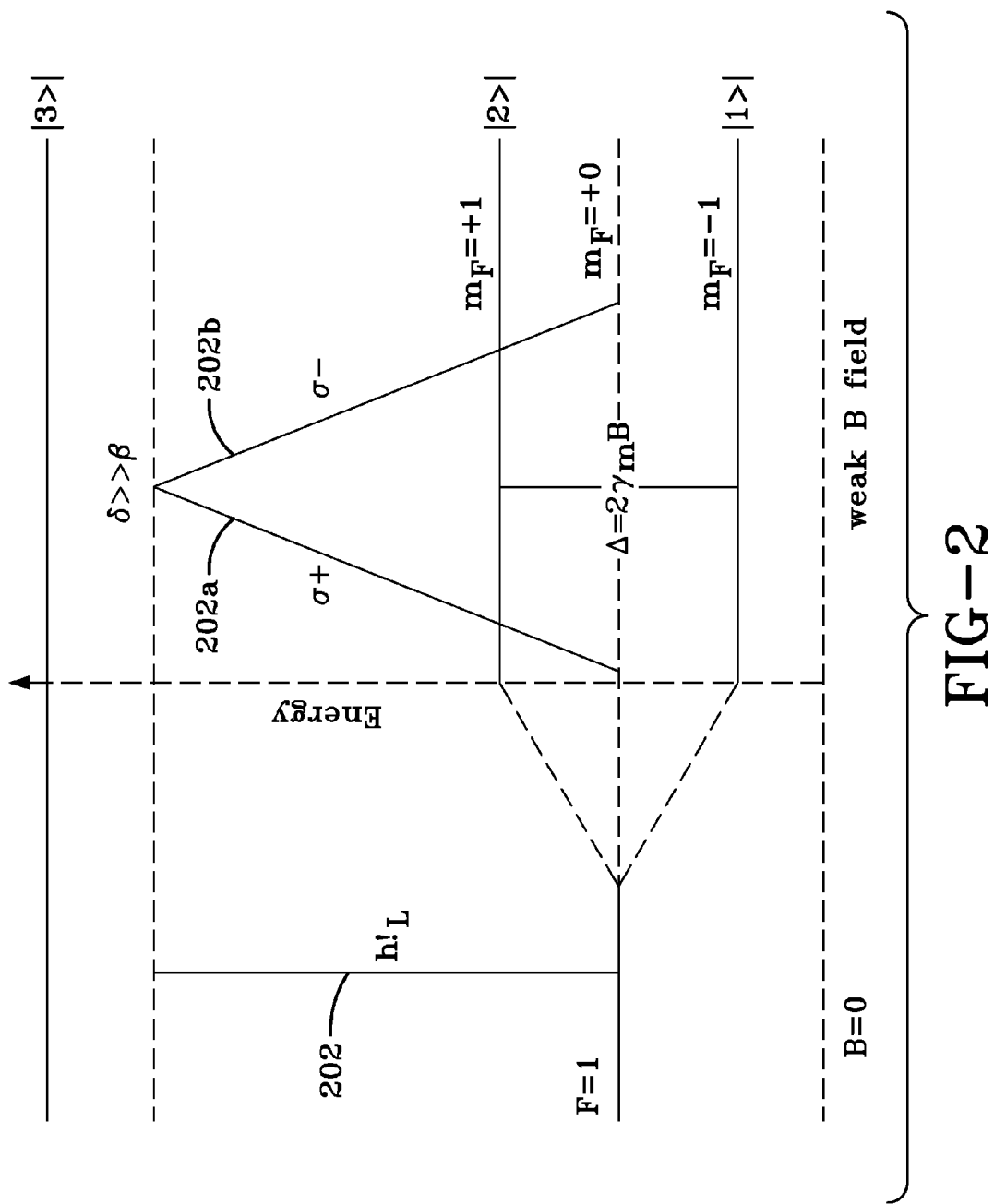
FIG. 2 is an energy level diagram showing a nominally two level atom with F=1 ground state in a weak magnetic field illuminated by a linearly polarized laser field in accordance with the disclosed subject matter.

FIG. 2 shows a schematic representation of a nominally two-level level atom with F=1 ground state in a weak magnetic field illuminated by a single monochromatic linearly polarized laser field. In the presence of the weak magnetic field, the ground state degeneracy is broken and the system becomes a three-level system. Since a linearly polarized field can be thought of as a linear superposition of right ($\sigma^-$) and left ($\sigma^+$) circular polarized fields, this system is equivalent to two fields of opposite handedness. The Hamiltonian of this system is given by:

$$H=\hbar\omega_o|3\rangle\langle 3|+\hbar\gamma_m B|2\rangle\langle 2|-\mu\cdot E_T(z,t) \quad (29)$$

where $\omega_o$ is the zero magnetic field transition frequency, $\gamma_m$ is the Zeeman shift of the levels due to the magnetic field, $\mu$ is the atomic electric dipole moment (to be distinguished from the magnetic dipole moment $\mu_m$) and $E_T(z,t)$ is the total field of the laser, given by $E_T(z,t)=\epsilon(t)e_L\exp[-i(\omega_L t-kz)]+c.c$ where $e_L$ is the laser polarization vector and the field amplitude is allowed to vary slowly with respect to an optical period to account for the possibility of pulses (e.g. $\pi/2$. and $\pi$ pulses). A well known treatment of the von Neuman equation of motion for the density operator is used $$\dot{\rho} = -\frac{i}{\hbar}[H,\rho] \quad (30)$$

and projecting along the atomic states. Decay from the excited state $|3\rangle$ down to both lower $W_{32}$ and $W_{31}$ and from the higher ground state $|2\rangle$ to the lower ground state $|1\rangle$ ($W_{21}$) is also included phenomenologically as well as possible incoherent transfer up from the lower state $|1\rangle$ to the higher ground state $|2\rangle$ ($W_{12}$) However, it is assumed that there is no incoherent excitation from the ground states to the excited state ($W_{13}=W_{23}=0$). Polarization decay rates ($\gamma_{ij}$) between levels i and j can be derived from the population decay rates through the formula $$\gamma_{ij} = \frac{1}{2}\sum_{k=1}^{3}[W_{ik}+W_{jk}] \quad (31)$$

Removing the high frequency components by making the transformation:

$$\rho_{ii}(t)=\tilde{\rho}_{ii}(t)(i=1,2,3) \quad (32a)$$

$$\rho_{12}(t)=\tilde{\rho}_{12}(t) \quad (32b)$$

$$\rho_{13}(t)=\tilde{\rho}_{13}(t)\exp[i(\omega_L t-kz)] \quad (32c)$$

$$\rho_{23}(t)=\tilde{\rho}_{23}(t)\exp[i(\omega_L t-kz)] \quad (32d)$$

we are left with the equations:

$$\dot{\tilde{\rho}}_{11} = -W_{12}\tilde{\rho}_{11}+W_{21}\tilde{\rho}_{22}+W_{31}\tilde{\rho}_{33}+\frac{i}{2}[\Omega_1^*(t)\tilde{\rho}_{31}-\Omega_1(t)\tilde{\rho}_{13}] \quad (33a)$$

$$\dot{\tilde{\rho}}_{22} = -W_{21}\tilde{\rho}_{22}+W_{12}\tilde{\rho}_{11}+W_{32}\tilde{\rho}_{33}+\frac{i}{2}[\Omega_2^*(t)\tilde{\rho}_{32}-\Omega_2(t)\tilde{\rho}_{23}] \quad (33b)$$

$$\dot{\tilde{\rho}}_{33} = \quad (33c)$$
$$-(W_{32}+W_{31})\tilde{\rho}_{33}+\frac{i}{2}[\Omega_1(t)\tilde{\rho}_{13}+\Omega_2(t)\tilde{\rho}_{23}-\Omega_1^*(t)\tilde{\rho}_{31}-\Omega_2^*(t)\tilde{\rho}_{32}]$$

$$\dot{\tilde{\rho}}_{12} = -(\gamma_{12}-2i\gamma_m B)\tilde{\rho}_{12}+\frac{i}{2}[\Omega_1^*(t)\tilde{\rho}_{32}-\Omega_2(t)\tilde{\rho}_{13}] \quad (33d)$$

$$\dot{\tilde{\rho}}_{13} = -[\gamma_{13}+i(\delta-\gamma_m B-kv)]\tilde{\rho}_{13}+\frac{i}{2}[\Omega_1^*(t)(\tilde{\rho}_{33}-\tilde{\rho}_{11})-\Omega_2^*(t)\tilde{\rho}_{12}] \quad (33e)$$

$$\dot{\tilde{\rho}}_{23} = -[\gamma_{23}+i(\delta+\gamma_m B-kv)]\tilde{\rho}_{23}+\frac{i}{2}[\Omega_2^*(t)(\tilde{\rho}_{33}-\tilde{\rho}_{22})-\Omega_1^*(t)\tilde{\rho}_{21}] \quad (33f)$$

Figure 3:
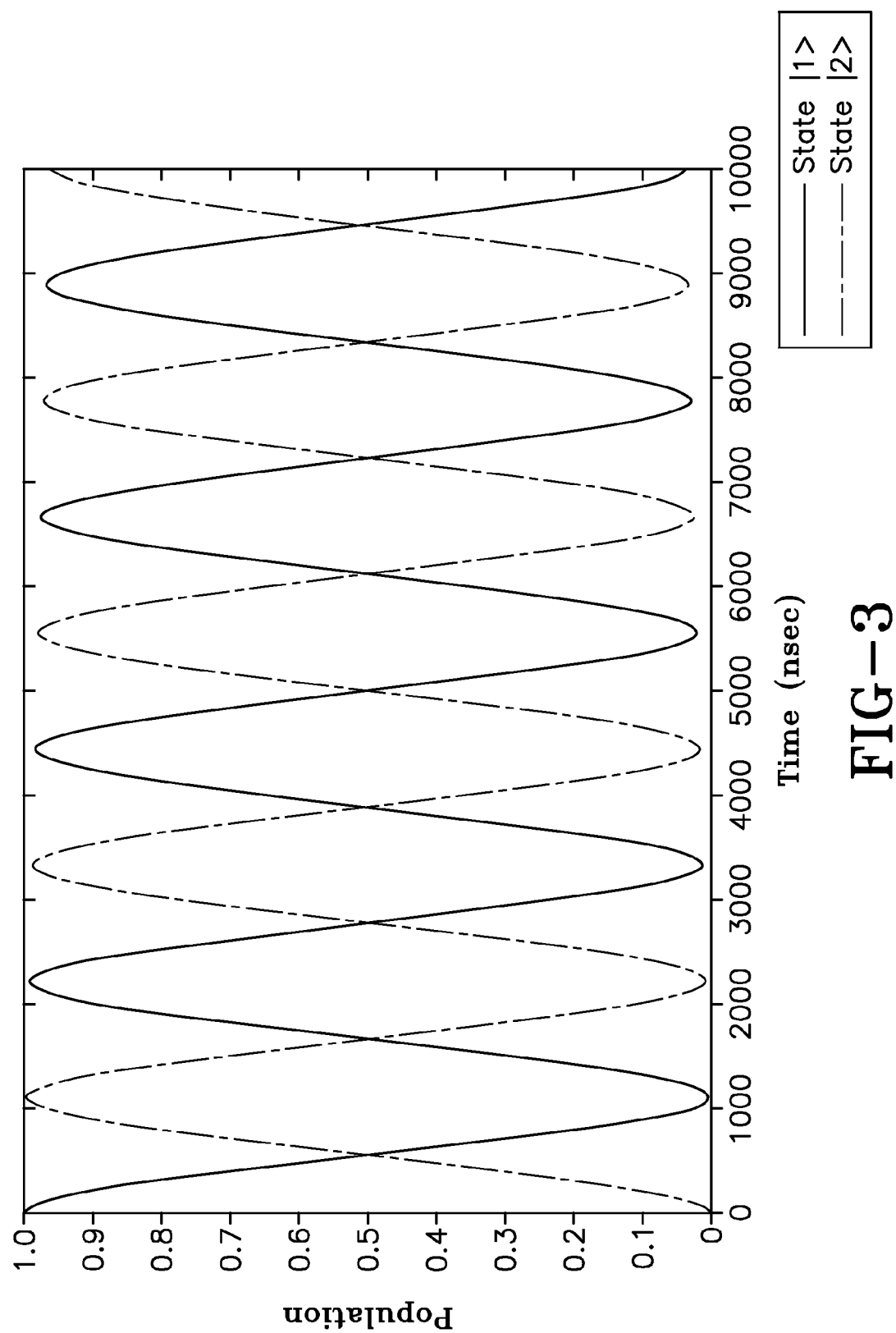
FIG. 3 is a graph of the atom population in states |1> and |2> being illuminated by a continuous field, in which the population oscillates periodically between the two states as a function of time, in accordance with the disclosed subject matter.
Figure 4:
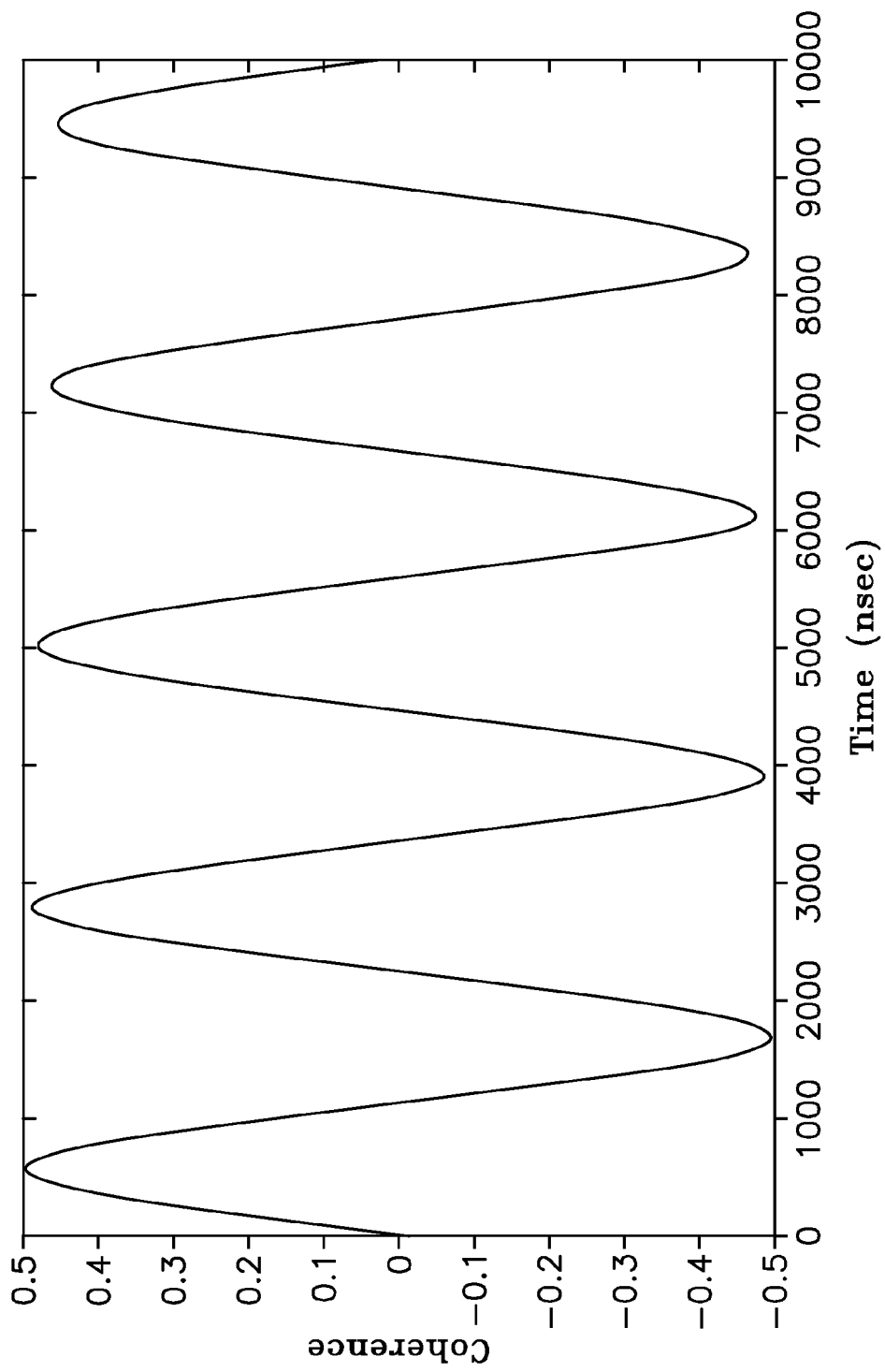
FIG. 4 is a graph of the relative coherence between states |1> and |2>, in accordance with the disclosed subject matter.

-continued $$\text{Here } \Omega_i = \frac{2\mu_{i3}\cdot e_L\varepsilon}{\hbar} \quad (i=1,2) \quad (34)$$

represents the Rabi coupling between the ith lower state and the excited state and $\delta$ is the detuning of the laser from the zero field resonance frequency of the atom. These equations are derivable from standard equations of motion that describe electro-magnetically induced transparency in a $\Lambda$ system (see, e.g., Abi-Salloum, T.; Davis, J. P.; Lehman, C.; Elliott, E.; Narducci, F. A. J. Mod. Opt. 2007, 54, 2459-2471, which uses similar notation) by letting $\delta_1\rightarrow\delta-\gamma_M B$ and $\delta_2\rightarrow\delta+\gamma_M B$. The coupled Equations (34a)-(34f) can be integrated in time using standard Runge-Kutta methods. A typical run is displayed in FIG. 3 for the values of the parameters shown for a continuous field (i.e. $\epsilon$=constant)). We see that the population oscillates between the two states as a function of time. Furthermore, as depicted in FIG. 4, the process is coherent. The decay of the population from full excitement is due to the fact that the atom is not detuned infinitely far away, so that after some time, spontaneous emission begins to play a role. We see that therefore if a beam of light were to be left on for a time equal to 1 microsecond (which corresponds to a time $\Omega_{2p}t=\pi/2$ where $\Omega_{2p}$ is the two photon Rabi frequency), the atom would be in a 50:50 superposition of state $|1\rangle$ and state $|2\rangle$ with maximal coherence. This pulse of light has the effect of being an atom beam splitter. A beam of light that is left on twice as long has the effect of transferring all the population from one state (say $|1\rangle$) to the other state (say, $|2\rangle$), which has the effect of being an atom mirror. We are currently comparing our three level model here to a full 24-level model for rubidium 87 or a full 36-level model for rubidium 85. However, it can be pointed out that a clean three representation of this model which we have presented here can be realized in rubidium 87 with the selection of F=1 for the ground state and F'=0 for the excited state.

Experimental Embodiment

In this section, an experimental embodiment according to the present invention is described. It should be noted that, although the description below is based on laser-cooled atoms, beams of faster moving atoms can be used as well for the invention. Laser-cooled atoms have been used in this embodiment to reduce the size of the device.

The experimental embodiment centers on a standard rubidium 85 magneto-optical trap (MOT), although other atoms can be used; for example, sodium, cesium, potassium and the other alkali and alkaline earth elements. In general, a MOT is a device that cools down non-charged (neutral) atoms to temperatures near absolute zero and traps them at a certain place using spatially varying magnetic fields and circularly polarized light. To simplify the discussion, only the major components of the MOT are presented. However, it will be understood by those of skill in the art that a number of standard optical components that are not shown would be included in any implementation of a MOT and that this configuration is not unique. FIGS. 8 and 9 show top and side views, respectively, of an ultra-high vacuum chamber 602 (P<$10^{-9}$ torr) that contains a MOT 600. Referring to FIG. 8 which shows a top view of the vacuum chamber laser beams enter the vacuum chamber along.

FIG. 8 shows an apparatus for generating the laser-cooled sample of atoms. A variety of implementations exist. For additional information, see *Laser Cooling and Trapping* by Harold Metcalf and Peter van der Straten, (1999) ISBN 0-387-98728-2, incorporated herein by reference for background purposes, as if fully set forth. Referring to FIG. 8, a beam 801 from a master laser 802 is split into two beams 804 and 806 at a beam splitter 808. Beam 804 is sent to a saturated absorption spectrometer 812 which serves to first identify the frequency of the master laser 802 and then serves as a feedback signal for the master laser 802 stabilization. Beam 806 is further split at beamsplitter 809 and directed into a slave laser 810. The slave laser 810 emits a beam 807 which has the same frequency of light as the master laser 802 but higher in power. Beam 807 is then further amplified by a tapered amplifier 814 and then spatially filtered by a polarization maintaining single mode fiber 816. The light emerging from the fiber 817 is split by a series of polarizing beam splitters 818, 820 and 822 which emit beams 819, 821 and 823. Beams 819, 821 and 823 are then double-passed through acousto-optic modulators 824, 826 and 828, respectively, where they acquire a frequency shift. One of the frequency shifted beams 825 is further split by a polarizing beams splitter 831 into beams 833 and 835. Beam 833 is injected into a fiber 837, which becomes the +y- and −y cooling and trapping beams 606a and 606b depicted in FIG. 8. Similarly, the other output 835 from beam splitter 831 is injected into a fiber 839, which becomes the +x and −x cooling and trapping beams 604a and 604b. The frequency shifted versions of beams 821 and 823, which are 827 and 829, are directed into fibers 841 and 843, respectively, which become the −z and +z cooling and trapping beams 608a and 608b depicted in FIG. 9, respectively.

As is familiar to those of skill in the art, a repumper field (not illustrated) is required to illuminate the atoms. In this implementation, a repumper field is delivered to the atoms via a second input port along the x-fiber. Other implementations could inject the repumper field along any or all fibers or could frequency-modulate the master and/or slave to provide the repumper field.

Nulling the Stray Magnetic Field

It is important to have a good idea of what the magnetic field is (in the absence of the trapping magnetic field) at the location of the atoms inside the vacuum chamber. Because embodiments according to the present invention are intended for making measurements in Earth field, shielding was not applied to the experimental chamber. Instead, stray fields were nulled using three orthogonal sets of coils (20 turns per coil) mounted on an aluminum frame in the shape of a cube having sides approximately 69 cm centered on the vacuum chamber. The method of polarization rotation as described, for example, in Labeyrie, G.; Miniatura, C.; Kaiser, R. Phys. Rev. A 2001, 64, 033402-1-7, and Nash, J.; Narducci, F. A. J. Mod. Opt. 2003, 50, 2667-2675, were used to measure the magnetic field. The amount of polarization rotation can be calculated from Equations (34a)-(34f) by calculating the real part of $\tilde{\rho}_{13}$ and it is, of course, a function of the magnetic field. A time sequence similar to Nash, J.; Narducci, F. A. J. Mod. Opt. 2003, 50, 2667-2675, was employed.

The MOT is formed by turning on the trapping field, the repumper, and the gradient coils at t¼0 for 2995 ms, at which time the repumper and the gradients coils are switched off (in 125 ns and 5 ms, respectively). The cooling beams are left on for an additional 5 ms for additional cooling (although no particular effort was made to induce polarization gradient cooling) and to hold the atoms while the gradient coils were decaying. At t=3000 ms, a bias field $B_{bias}$ is switched on (switching time of about 3 ms) while the cooling fields are switched off, leaving the atoms in the dark. At t=3005 ms, a scanning probe field whose center frequency is the cooling resonance of the atoms and whose radius is roughly the size of the MOT is turned on along with the repumper (still oriented along the x axis of the MOT), passed though the sample and scanned through the resonance in 2 ms.

The probe field is incident on the MOT at 45° with respect to the x-y trapping beams and is linearly polarized 45° with respect to a calcite beam splitter located after the MOT. The probe beam enters the vacuum chamber via vacuum port 612 and exits the chamber via vacuum port 614. The calcite splitter separates the beam of light into its horizontal and vertical components, but into parallel but displaced beams. This arrangement makes it convenient to send the light onto a two-sided detector and a common transimpedance amplifier for noise reduction. The bias field was switched on after the fall of the trapping beams, rather than at the very beginning of the run because to compare the rotation signal for otherwise equal MOTs. Since the rotation signal is dependent on the density, changing the bias field under which the MOT is formed might change the density. In this manner, the density of the MOT remained the same from shot to shot.

A typical trace is displayed in FIG. 4(a). By varying the current in the bias coils, we could reduce the amplitude of the rotation signal until it disappeared and then changed sign (indicating the reversal of the total field $B_{total}=B_{stray}+B_{bias}$). A plot of the rotation amplitude versus applied current is shown in FIG. 4(b). By selecting the current at which the rotation signal crosses through zero, we can establish the zero point in the magnetic field along the axis of the probe field. In principle, this can be done along the other two axes to zero the field in all three directions. In this particular embodiment, the field can be measured at 90° to the current arrangement in the x-y plane, but because of the presence of the z trapping fields, the measurements cannot be repeated along that axis. Thus, the measurement of the Larmor precession is used as an alternate technique to zero the field along the z direction.

Measurement of the Occupation of the Magnetic States

Figure 5:
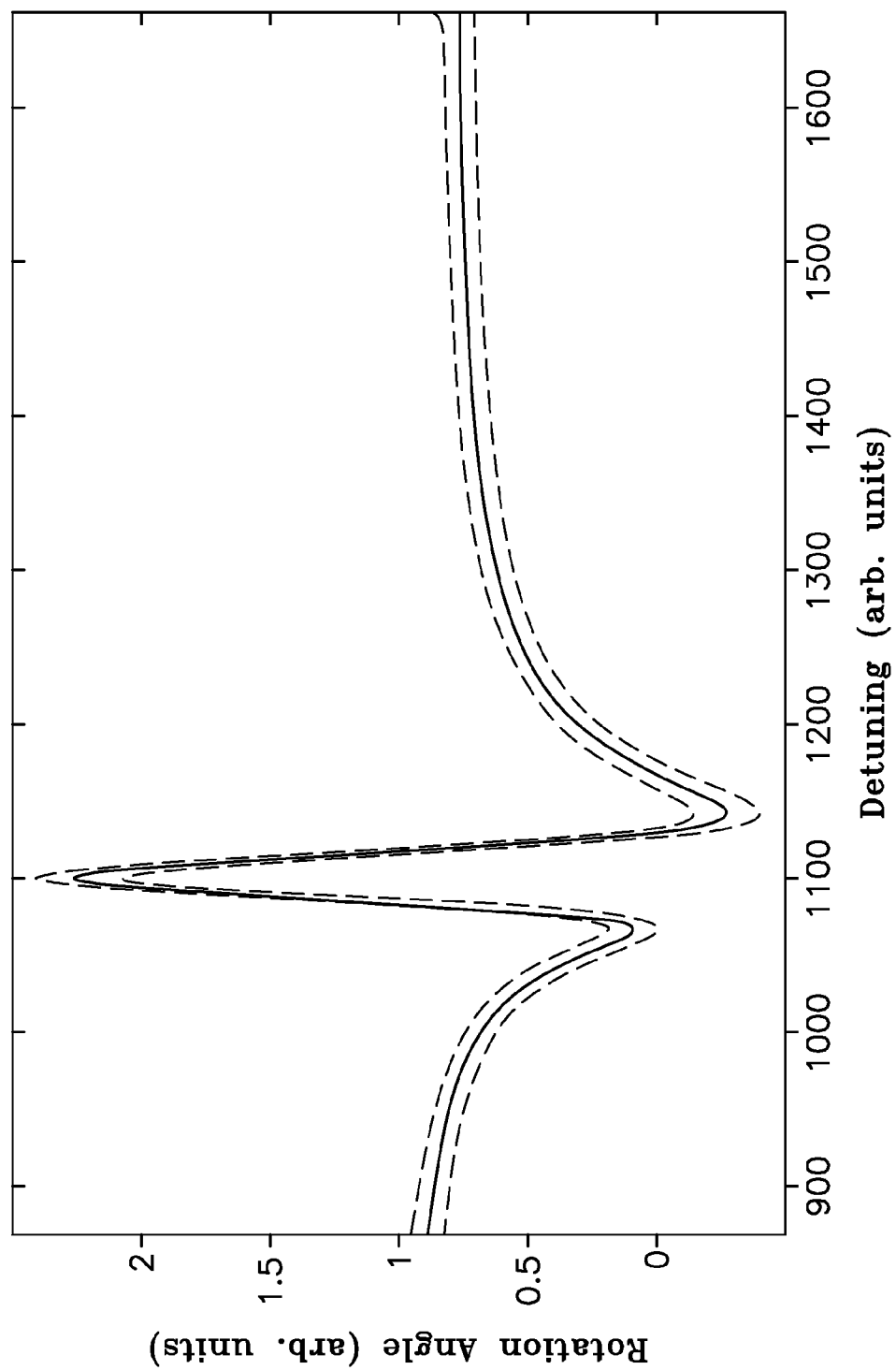
FIG. 5 shows a plot of a typical experimental trace of a polarization rotation signal versus laser frequency, in accordance with the disclosed subject matter.

The probe field described in the section above is delivered to the chamber via a two-by-two 50/50 fiber. Through the introduction of a second scanning laser and a few waveplates, the relative population in either of the magnetic levels can be probed. For these measurements, the probe field (now denoted by Probe 1) is sent to the chamber along the vertically oriented polarization axis of the fiber so that the field emerging from the fiber is polarized vertically. The light is then sent through a quarter waveplate and then to the chamber. A second waveplate is placed after the chamber followed by a polarizing beam splitter. The quarter waveplate is oriented, in the absence of the MOT, so that the light is completely transmitted to a detector. Light from a second scanning laser (Probe 2), also tuned to the cooling transition is incident on the second input port of the fiber. The polarization of this laser at the input face is horizontal, 90 with respect to the Probe 1 field, so that at the exit port of the chamber, the light is reflected by the polarizing beam splitter, rather than transmitted. The fields of both lasers were kept very weak so as not to influence the relative populations. We followed the timing sequence already described in Section 4.1. Both scanning lasers were turned on at the same time and utilized the same ramp signal for the scan. However, the center frequency of each laser was adjusted so that the Probe 1 laser reached resonance (and passed through it) before the Probe 2 laser. A typical trace is displayed in FIG. 5. Since the absorption is proportional to the population in the ground state, we can use this technique to measure the population in one ground state versus the other. The next step is to apply the techniques described in the section immediately above, to coherently move population from one state to the other, before finally demonstrating our interferometer.

Figure 6:
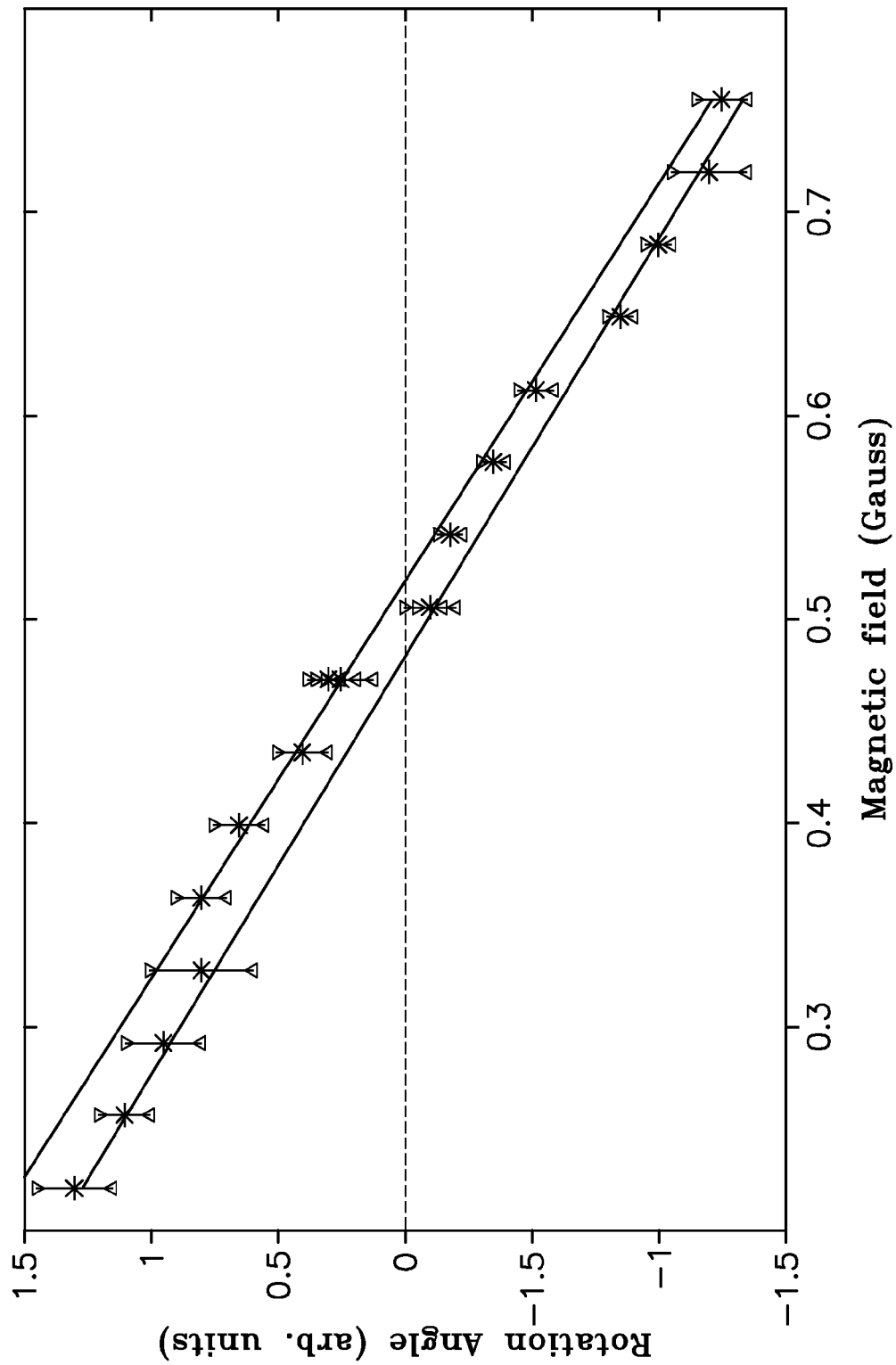
FIG. 6 shows a graph of the maximum polarization rotation as a function of the applied magnetic field, in accordance with the disclosed subject matter.
Figure 7:
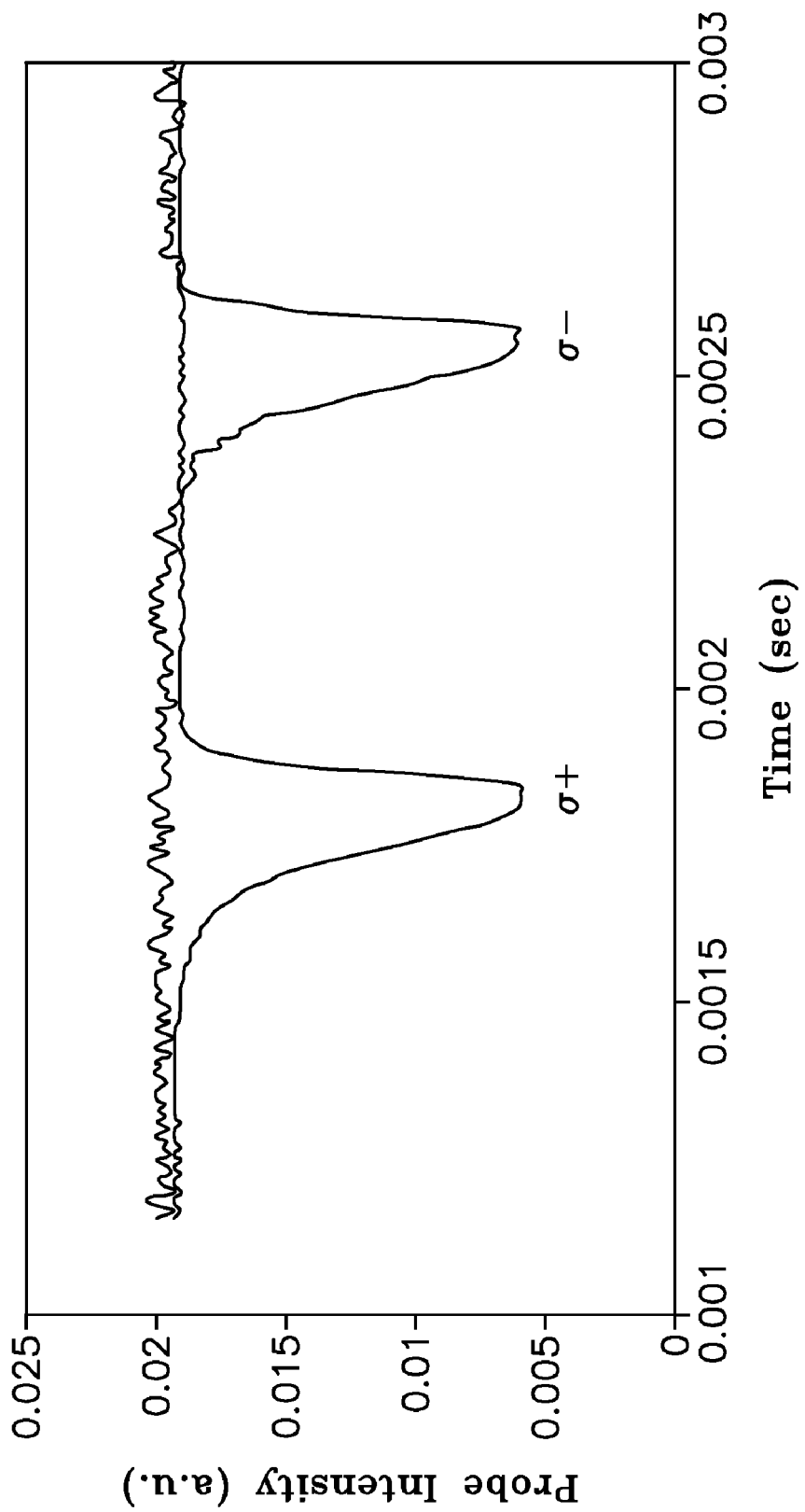
FIG. 7 shows a plot of a typical experimental trace of the absorption of two probe fields of opposite circular polarization, in accordance with the disclosed subject matter.

FIG. 6 is a depiction of the vacuum chamber from above. The trim coils used to make slight adjustments in the horizontal components of the ambient magnetic field at the location of the MOT are shown. The coils are positioned at 45° degrees relative to the trapping beams.

FIG. 9 shows the vacuum chamber from the side. The trim coils used to make adjustments in the vertical component of the ambient magnetic field at the location of the MOT are shown. These coils are not positioned with an angle difference relative to the trapping beams.

Figure 10:
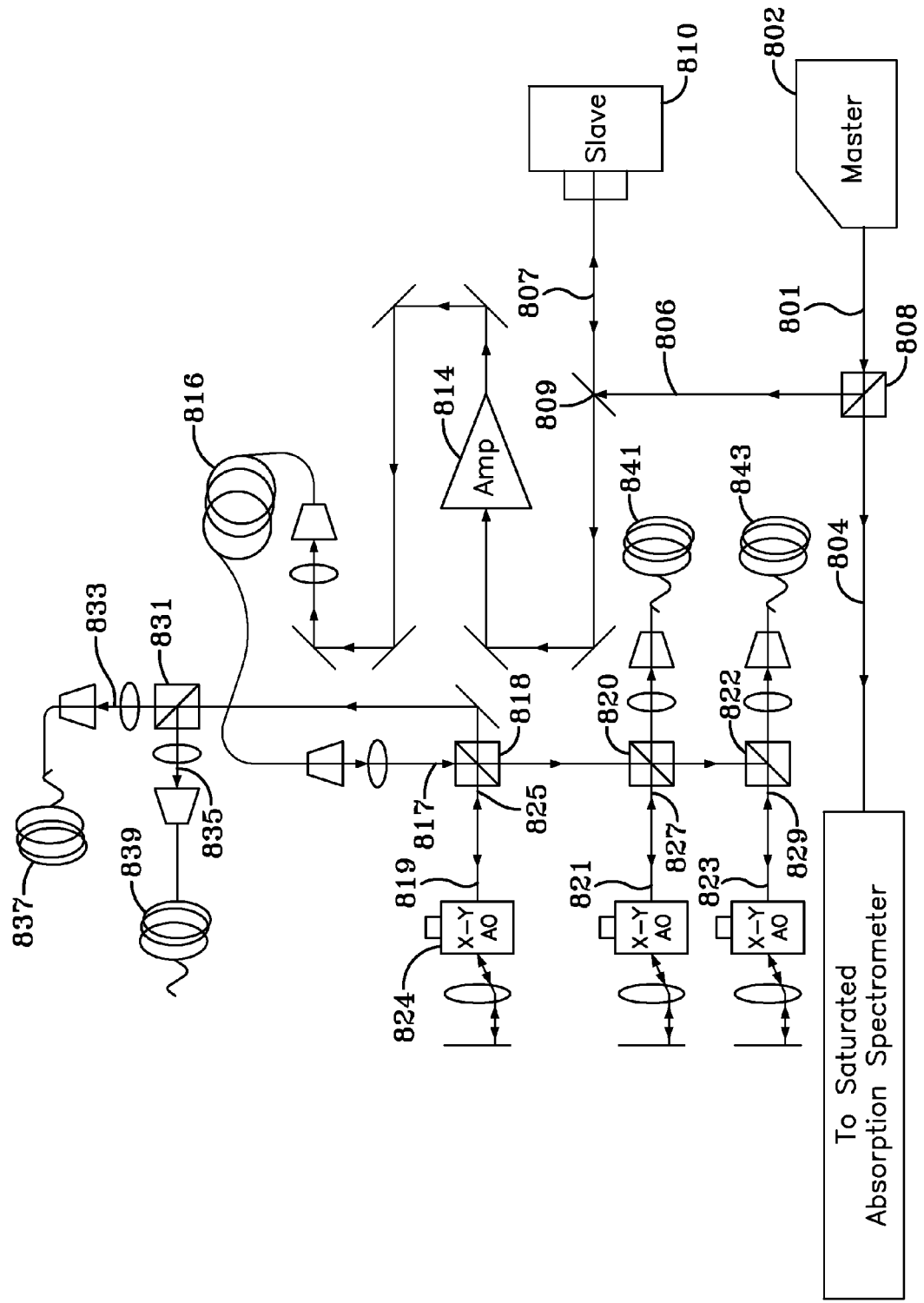
FIG. 10 is a schematic depicting the optical layout used for the generation of the laser beams in a magneto-optical trap, in accordance with the disclosed subject matter.

FIG. 10 shows a simplified optical layout used for the generation of the laser beams in a magneto-optical trap, in accordance with the present invention. Referring to FIG. 10, a beam 801 from the master laser 802 is split into two beams 804 and 806 at a polarizing beam splitter 808 after having passed through an optical isolator and an anamorphic prism pair, (not illustrated) and a half-wave plate 803 which is used to control the relative intensity of beams 804 and 806. Beam 806 is used to injection lock a Slave laser 810 and beam 804 is sent to a conventional saturated absorption spectrometer locking arm 812. A portion of beams 806 and 807 are sent into a standard Fabry-Perot resonator/photodiode combination 813. The beam from the Slave laser 807 is amplified at a tapered amplifier 814 and then sent through a fiber optic cable 816 in order to provide a spatially clean beam.

The light out of the fiber 816 is split three times at polarizing beam splitters 818, 820 and 822. The resultant three beams 819, 821 and 823 are then each double-passed through acousto optic modulators 824, 826 and 828, respectively, to provide a specific frequency shift. After splitting one of these beams (in this case beam 819), the resultant four beams are sent into their respective fibers, labeled, X, Y, −Z, and +Z to denote the direction of the light beams at the vacuum chamber (not illustrated in FIG. 8.)

Figure 11:
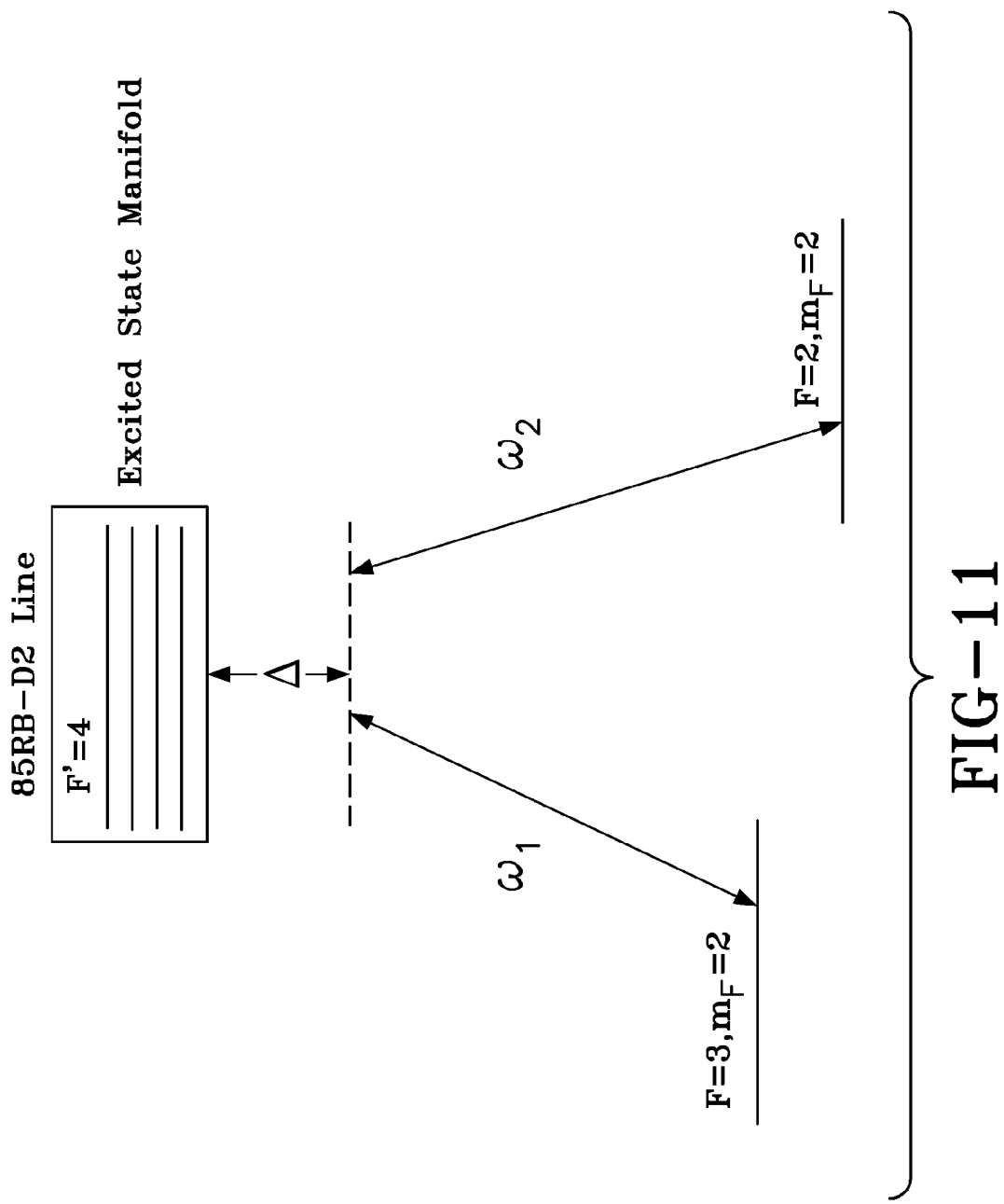
FIG. 11 depicts the energy levels in Rubidium 85 isotope used in accordance with the disclosed subject matter.

FIG. 11 depicts the transitions used in this invention. These are the F=3, $m_F=2 \rightarrow F'=3$ and F=2, $m_F=2 \rightarrow F'=2$ transitions in 85Rb. The frequency difference between the two laser fields must be equal to the frequency separation of the two ground state magnetic sublevels. However, as would be apparent to someone with skill in the art, these particular transitions are not the only ones that can be used. Furthermore, 85Rb is not the only atom that can be used.

Figure 12:
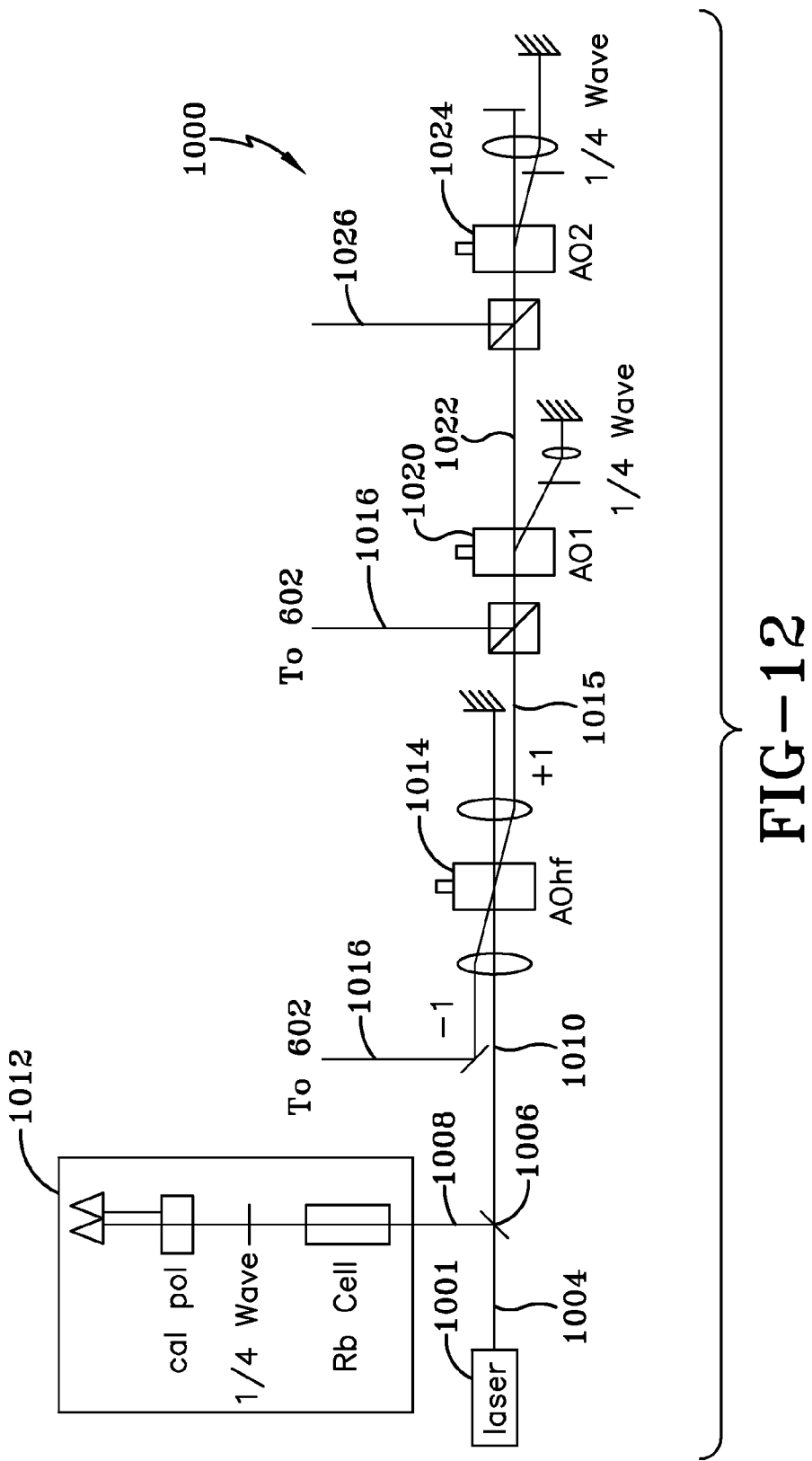
FIG. 12 depicts the optical layout for the generation of the pairs of laser beams used for the atom beam splitter and atom mirror and for the measurement of the temperature of an atom cloud, in accordance with the disclosed subject matter.

FIG. 12 shows a simplified Raman laser layout 1000. This design allows one laser to easily switch between two different measurements. The Raman layout 1000 starts with laser 1001 which emits a beam of light 1004. This light beam 1004 is split by beam splitter 1006 into two light beams 1008 and 1010. Beam 1008 provides a reference beam of light to detect the frequency of the light relative to the transition frequency of the atom by using a standard dichroic atomic vapor laser lock (DAVLL) scheme 1012. Beam 1010 passes through a high-frequency acousto-optic modulator 1014, producing two beams of different frequencies, 1016 and 1015. Beam 1016 is one component of the Raman fields. Beam 1016 is sent to the vacuum chamber 602. Beam 1015 is then passed through acousto-optic modulator 1020 which generates two beams, 1018 and 1022. Since beam 1018 is double-passed through acousto-optic modulator 1020, it forms the second component of the Raman field. Beam 1022 is double passed through a final acousto-optic modulator 1024, resulting in beam 1026. Beam 1018 can be used in combination with beam 1026 to provide an auxiliary measure of the temperature of the cold atom source.

Operation of Experimental Embodiment

The following is the timing sequence of an exemplary embodiment according to the present invention:

The cold atom source is formed by turning on the trapping beams, the repumping beam and the gradient magnetic fields. At this time, the trim coils for the magnetic fields cancellation are on.

Once the cold atom cloud is formed, the trim coils are turned off

The atom cloud is launched vertically from its initial position, called the origin P0.

A pulse from the Raman beams is applied (the first Raman beam splitter) when the atoms are just above the origin, approximately 1 mm above the origin, called P1.

At the top of the trajectory, called P2, the second Raman beam is applied (the Raman atom mirror)

At the bottom of the trajectory, at P1, a final Raman beam is applied (the final beam splitter.

At the origin P0, an on-resonance light beam is applied to measure the number of atoms in one state versus the other.

Conclusion

As has been shown, embodiments according to the invention utilize atom interferometry techniques for the measurement of gradient magnetic fields. It has been shown that embodiments of a gradient magnetometer atom interferometer according to the present invention are inherently sensitive to gradient magnetic fields and have the added non-trivial advantage of being insensitive (at least to the zero$^{th}$ order that we have considered) to magnetic fields themselves. Additionally, it has been shown how coherent superpositions of magnetically sensitive transitions can be created. Additionally, practical examples of the nulling of stray B-fields in experimental embodiments without the aid of shields, and the probing of the relative population in the higher and lower magnetic sublevels have been shown. In all cases, it is understood that the above-described arrangements are merely illustrative of but a few of the many possible specific embodiments which can represent applications of the principles and techniques of the present invention. Numerous and varied other arrangements can be readily devised in accordance with these principles and techniques by those skilled in the art without departing from the spirit and scope of the invention. Accordingly, the scope of the invention should be determined by the following claims and their legal equivalents.

What is claimed is:

1. A method for measuring a magnetic gradient, comprising:
generating a beam of like atoms with magnetic sublevels;
applying a first pulse of electro-magnetic radiation to the beam of atoms, wherein the product of the Rabi frequency and T equals $\pi/2$, to create a coherent superposition of the magnetic sublevels in the atoms and wherein the superposition results in a plurality of beams following separate paths and wherein at least two of the paths comprise arms of an interferometer;
applying a second pulse of electromagnetic radiation to both beams of atoms a time T later with characteristics substantially similar to the first pulse, wherein the product of the Rabi frequency and T equals $\pi$, whereby the states of the atoms in the two arms of the interferometer are coherently interchanged and are redirected towards each other;
recombining the beams of atoms by apply a third pulse of electromagnetic radiation a time $T\pm\Delta t$ after the second pulse with characteristics substantially similar to the first pulse such that the paths form a closed loop; and directing a detecting pulse of electro-magnetic radiation at a time after the third pulse to detect the number of atoms in one magnetic sublevel versus another magnetic sublevel.

2. The method for measuring a magnetic gradient according to claim 1, wherein the beam of atoms is laser cooled.

3. The method for measuring a magnetic gradient according to claim 1 wherein the first pulse of light is comprised of two frequency components that are counter-propagating and whose frequency difference matches the frequency difference of the magnetic sublevels being used.

4. The method for measuring a magnetic gradient according to claim 3 further comprising directing a preparation pulse of electro-magnetic radiation whose polarization is such that at least one desired magnetic sublevel of the beam of atoms is populated in order to measure a change in the number of atoms in one magnetic sublevel.

5. The method for measuring a magnetic gradient according to claim 3 wherein the first pulse of electro-magnetic radiation has a temporal length that depends on the intensity of the two frequency components in the pulse.

6. The method for measuring a magnetic gradient according to claim 3 wherein the polarization of the frequency components, the relative frequency between the atomic transition and the laser frequencies, and characteristics of the transitions between magnetic sublevels are such that a coherent superposition of these magnetic sublevels with equal probability amplitudes is created.

7. The method for measuring a magnetic gradient according to claim 1 wherein the detecting pulse of electro-magnetic radiation is resonant with an atomic transition and polarization handedness appropriate for a magnetic sublevel to be detected.

8. The method according to claim 1, further comprising repeating the steps of the method for measuring a magnetic gradient of claim 1, but employing a different value for $\Delta t$ in order to display an interferometer pattern.

9. The method according to claim 1, further comprising repeating the steps of the method for measuring a magnetic gradient of claim 1 employing the same value for $\Delta t$ in order to measure temporal changes in the magnetic field gradient.

10. A method for measuring a magnetic gradient, comprising:
cooling a vapor sample of atoms with magnetic sublevels in a ultra-low pressure cell by directing at the sample at least one trapping beam and a repumping beam;
energizing a gradient magnetic field around the sample;
eliminating any ambient magnetic field around the sample to create a cooled sample of atoms;
exposing the cooled atom sample to the ambient magnetic field;
launching the atoms along a launch direction by applying counter-propagating beams which are frequency offset from each other;
preparing the sample of atoms such that all the atoms are in the same magnetic sublevel;
creating a coherent superposition of magnetic sublevels which also physical separate into at least two beams of atoms by applying a pulse of light from a Raman beam;
redirecting at least some of the beams of atoms towards each other by applying a second pulse of light from the Raman beam;
recombining the atom beam paths by applying a third pulse of light from the Raman beam; and
detecting the number of atoms in a desired magnetic sublevel in order to derive the gradient magnetic field by directing a near-resonant laser beam with appropriate polarization through the atom sample.

11. The method of claim 10 wherein eliminating any ambient magnetic field around the sample to create a cooled sample of atoms is performed by energizing trim coils around the sample.

12. The method of claim 11 wherein exposing the cooled atom sample to the ambient magnetic field is performed by de-energizing the trim coils.

13. The method of claim 12 wherein preparing the sample of atoms such that all the atoms are in the same magnetic sublevel is performed by directing a beam of light with polarization appropriate to the desired magnetic sublevel.

* * * * *